United States Patent [19]

Kim

[11] Patent Number: 5,389,494
[45] Date of Patent: Feb. 14, 1995

[54] RADIATION-SENSITIVE MIXTURE AND PRODUCTION OF RELIEF IMAGES

[75] Inventor: Son N. Kim, Hemsbach, Germany

[73] Assignee: Basf Aktiengesellschaft, Ludwigshafen, Germany

[21] Appl. No.: 592,297

[22] Filed: Oct. 3, 1990

[30] Foreign Application Priority Data

Oct. 25, 1989 [DE] Germany ............................ 3935451

[51] Int. Cl.$^6$ ............................................. G03C 1/492
[52] U.S. Cl. .................................... 430/270; 430/311; 430/326
[58] Field of Search ......................... 430/270, 311, 326

[56] References Cited

U.S. PATENT DOCUMENTS 4,883,740 11/1989 Schwalm et al. .................. 430/270
4,931,379 6/1990 Brunsvold et al. ................. 430/270
5,023,164 6/1991 Brunsvold et al. ................. 430/270

FOREIGN PATENT DOCUMENTS 0342496 11/1989 European Pat. Off. .

Primary Examiner—Marion E. McCamish
Assistant Examiner—Mark A. Chapman
Attorney, Agent, or Firm—Keil & Weinkauf

[57] ABSTRACT

A radiation-sensitive mixture essentially consisting of
(a) a binder or binder mixture which is insoluble in water but soluble in aqueous alkaline solutions and
(b) a compound which forms a strong acid on exposure to radiation, wherein the binder (a) used is a phenolic resin in which from 5 to 50% of the phenolic hydroxyl groups have been replaced by β-halogenated alkyl carbonate groups, is suitable for the production of relief structures.

8 Claims, No Drawings

RADIATION-SENSITIVE MIXTURE AND PRODUCTION OF RELIEF IMAGES

The present invention relates to positive-working radiation-sensitive mixtures which contain a binder which is soluble in aqueous alkaline media and contains polymerized a strong acid on exposure to radiation, the solubility of the compound in an alkaline solvent being increased by the action of the acid. These mixtures are sensitive to UV radiation, electron beams and X-rays and are particularly suitable as resist materials and for the production of relief images.

Positive-working radiation-sensitive mixtures are known. In particular, positive-working resist materials which contain o-quinonediazides in binders, eg. novolaks, which are soluble in aqueous alkaline media are used commercially. However, the sensitivity of these systems to radiation, in particular short-wavelength radiation, is unsatisfactory in some cases.

Increases in sensitivity in radiation-sensitive systems which, in the primary photoreaction, produce a species which then initiates a catalytic secondary reaction independently of the radiation have likewise been described. U.S. Pat. No. 3,932,514 and U.S. Pat. No. 3,915,706 describe, for example, photoinitiators which subsequently cleave acid-labile groups, such as polyaldehyde groups, in a secondary reaction.

Radiation-sensitive mixtures which are based on acid-clearable compounds and contain, as a binder, a polymer which is soluble in aqueous alkaline media, and a compound which forms a strong acid in a photochemical reaction and a further compound having acid-cleavable bonds, which increase their solubility in an alkaline developer as a result of the action of the acid, are also known (cf. for example DE-A-3 406 927). Compounds mentioned as-suitable for forming a strong acid in a photochemical reaction are diazonium, phosphonium, sulfonium, iodonium and halogen compounds. The use of these onium salts as photochemical acid donors in resist materials is also disclosed in, for example, U.S. Pat. No. 4,491,628. Crivello in Org. Coatings and Appl. Polym. Sci. 48 (1985), 65–69 gives an overview of the use of onium salts in resist materials. Radiation-sensitive mixtures of polymers having acid-labile side groups and photochemical acid donors are disclosed in, for example, U.S. Pat. No. 4,491,628, 628, FR-A-2,570,844 and Polymeric Material Science and Engineering, A.C.S., 61 (1989), 417–421. However, these polymeric binders are hydrophobic and become alkali-soluble only after exposure.

Copolymers having phenolic and acid-labile groups, for example poly-(p-hydroxystyrene-co-tertbutoxycarbonyloxystyrene) are disclosed in J. Poly. Sci., Part A, Polym. Chem. Ed. 24 (1986), 2971–2980. However, if copolymers of this group which are also alkali-soluble are used in conjunction with commercial sulfonium salts, such as triphenylsulfonium hexafluoroarsenate, as also described in U.S. Pat. No. 4,491,628, these mixtures have the disadvantage that a very large amount of material is removed from the unexposed parts during development, since these sulfonium salts do not contribute sufficiently toward inhibition of solubility. Similar results are obtained if, in the abovementioned copolymer, the tertbutoxycarbonyloxystyrene units are replaced by tertamyloxycarbonyloxystyrene units.

DE-A-37 21 741 describes radiation-sensitive mixtures which contain a polymeric binder soluble in aqueous alkaline solutions and an organic compound whose solubility in an aqueous alkaline developer is increased by the action of an acid and which contains one or more acid-cleavable groups, this organic compound producing a strong acid on exposure to radiation. However, these systems have disadvantages for certain intended uses.

It is an object of the present invention to provide highly active radiation-sensitive systems for the production of relief structures, which systems can be developed with aqueous alkaline solutions and permit the production of photosensitive layers having high transparency in the short-wavelength UV range.

We have found that this object is achieved, surprisingly, by the use of phenolic resins, some of whose phenolic hydroxyl groups have been replaced by β-halogenated alkyl carbonate groups.

The present invention relates to a radiation-sensitive mixture, essentially consisting of a) a binder or binder mixture which is insoluble in water but soluble in aqueous alkaline solutions and
b) a compound which forms a strong acid on exposure to radiation, wherein the binder (a) used is a phenolic resin in which from 5 to 50% of the phenolic hydroxyl groups have been replaced by β-halogenated alkyl carbonate groups.

Suitable phenolic resins are novolaks which have mean molecular weights $\overline{M}_w$ of from 300 to 20,000 and in which from 5 to 50% of the phenolic hydroxyl groups have been replaced by β-halogenated alkyl carbonate groups, and poly-(p-hydroxystyrene) or poly-(p-hydroxy-α-methylstyrene) having mean molecular weights $\overline{M}_w$ of from 200 to 100,000 and in which from 5 to 50% of the phenolic hydroxyl groups have been replaced by β-halogenated alkyl carbonate groups, or mixtures of the stated phenolic resins.

The β-halogenated alkyl carbonate groups are preferably those of the general formula (I)

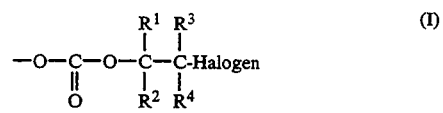

where halogen is chlorine or bromine, preferably chlorine, $R^1$ and $R^2$ are identical or different and are each hydrogen or methyl and $R^3$ and $R^4$ are identical or different and are each hydrogen or chlorine.

The novel radiation-sensitive mixtures preferably contain, as the compound (b) which forms a strong acid on exposure to radiation, one or more sulfonium salts of the general formula (II)

where R', R" and R''' are identical or different and are each alkyl of 1 to 3 carbon atoms, aryl, substituted aryl or aralkyl and $X^{\ominus}$ is $AsF_6^{\ominus}$, $SbF_6^{\ominus}$, $PF_6^{\ominus}$, $BF_4^{\ominus}$ and/or $CF_3CF_3SO_3^{\ominus}$. Other particularly preferred sulfonium salts are those of the general formula (II) where one or more of the radicals R', R" and R''' are a radical

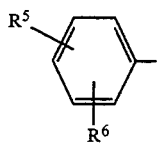

where $R^5$ and $R^6$ are identical or different and are each H, OH, alkyl of 1 to 3 carbon atoms or one of the radicals

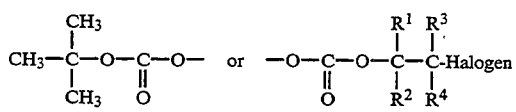

where halogen is chlorine or bromine, $R^1$ and $R^2$ are identical or different and are each hydrogen or methyl and $R^3$ and $R^4$ are identical or different and are each hydrogen or chlorine.

The novel radiation-sensitive mixtures generally contain from 70 to 98, preferably from 85 to 97, % by weight of component (a) and from 2 to 30, preferably from 3 to 15, % by weight of component (b).

The novel radiation-sensitive mixtures may additionally contain polycyclic aromatic compounds, eg. perylene or pyrene, as sensitizers which absorb radiation and transfer it to the acid-forming compound (b).

The present invention furthermore relates to a process for the production of relief structures or relief images by application of a photoresist solution in a layer thickness of from 0.1 to 5 μm to a substrate pretreated in a conventional manner, drying, imagewise exposure, heating to 50°–150° C. and development with an aqueous alkaline solution, wherein a photoresist solution which contains a novel radiation-sensitive mixture is used.

The novel radiation-sensitive mixtures are highly active systems which can very advantageously be used for the production of layers which are sensitive to short-wavelength UV radiation, in particular for relief images.

Regarding the radiation-sensitive mixtures, their components and their use, the following may be stated specifically.

(a) Suitable binders which are insoluble in water but soluble in aqueous alkaline solutions are phenolic resins, for example novolaks having mean molecular weights $\overline{M}_w$ of from 300 to 20,000, preferably from 500 to 5,000, for example novolaks based on p-cresol/formaldehyde, in particular poly-(p-hydroxystyrenes) and poly-(p-hydroxy-α-methylstyrenes), for example having mean molecular weights $\overline{M}_w$ of from 200 to 100,000, preferably from 5,000 to 40,000, provided that these phenolic resins contain β-halogenated alkyl carbonate side groups, and mixtures of such phenolic resins.

The polymers to be used according to the invention and based on p-hydroxystyrenes can be prepared by polymer-analogous reaction of, for example, poly-(p-hydroxystyrene) with the corresponding stoichiometric amounts of chlorocarbonic esters, imidazole-N-carboxylic esters or pyrocarbonic esters containing β-halogenated alkyl groups.

To introduce the β-halogenated alkyl carbonate groups poly-(p-hydroxystyrene), for example, can be reacted with the corresponding stoichiometric amount of an alkyl chlorocarbonate, NaOH solution being added to poly-(p-hydroxystyrene) and then, for example, 2,2,2-trichloroethyl chloroformate being added dropwise. The novel polymer can be obtained by precipitation in naphtha and can be purified by extraction with methylene chloride.

Examples of suitable starting materials for the preparation of novolaks having p-halogenated alkyl carbonate groups are the novolaks described in Novolak Resins Used in Positive Resist Systems by T. Pampalone in Solid State Technology, June 1984, pages 115–120. For special applications, for example for exposure in the short-wavelength UV range, novolaks obtained from p-cresol and formaldehyde are preferred.

Examples of suitable phenolic resins (a) containing β-halogenated alkyl carbonate groups can also be represented by the formula

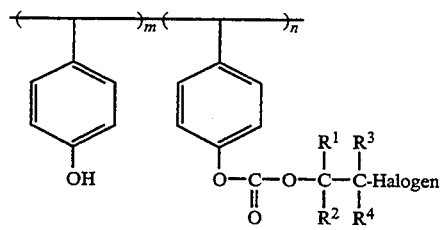

where $m \geq n$ and halogen and $R^1$ to $R^4$ have the abovementioned meanings.

According to the invention, from 5 to 50 %, preferably from 10 to 40%, of the phenolic hydroxyl groups of the phenolic resin have been replaced by β-halogenated alkyl carbonate groups.

The binder (a) to be used according to the invention can be particularly advantageously used as a binder for photoresists since it ensures good surface quality, removal of very little material in the unexposed parts and development without swelling.

Suitable acid donors (b) are all compounds which form a strong acid on exposure to radiation. However, sulfonium salts of the general formula (II)

where R', R" and R'" are identical or different and are each alkyl of 1 to 3 carbon atoms, eg. methyl or ethyl, aryl, eg. phenyl, substituted aryl, eg. substituted phenyl, or aralkyl, eg. benzyl, and $X^{\ominus}$ is $AsF_6^{\ominus}$, $SbF_6^{\ominus}$, $OF_6^{\ominus}$, $ClO_4^{\ominus}$, $BF_4^{\ominus}$ and/or $VF_3SO_3^{\ominus}$ (=triflate), are preferred for exposure to short-wavelength radiation.

Preferred sulfonium salts of this type are those of the general formula (II) in which one or more of the radicals R', R" and R'" are a radical

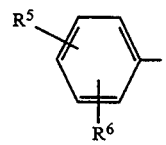

where $R^5$ and $R^6$ are identical or different and are each H, OH, alkyl of 1 to 3 carbon atoms, eg. methyl or ethyl, or one of the radicals

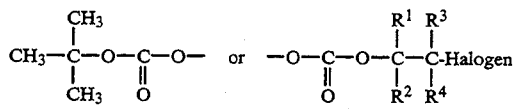

where halogen is chlorine or bromine, $R^1$ and $R^3$ are identical or different and are each hydrogen or methyl and $R^3$ and $R^4$ are identical or different and are each hydrogen or chlorine.

Examples of suitable sulfonium salts are trim phenylsulfoniumhexafluoroarsenate or hexafluorophosphate and dimethyl-4-hydroxyphenylsulfonium triflate or hexafluoroarsenate.

Other acid donors can also be used as component (b), for example the iodonium compound

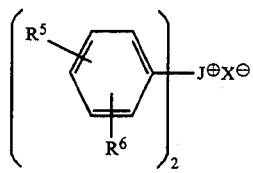

where $R^5$, $R^6$ and $X^\ominus$ have the abovementioned meanings.

The novel mixtures are preferably dissolved in an organic solvent, the solids content generally being from 5 to 40% by weight. Preferred solvents are aliphatic ketones, ethers and mixtures thereof, in particular ethylcellosolve, butylglycol, methylcellosolve and 1-methoxy-2-propanol, alkylene glycol alkyl ether esters, for example methylcellosolve acetate, ethylcellosolve acetate, methylpropylene glycol acetate and ethylpropylene glycol acetate, ketones, for example cyclohexanone, cyclopentanone and methyl ethyl ketone, acetates, such as butyl acetate, and aromatics, such as toluene and xylene. The choice of the corresponding solvents and mixtures thereof depends on the choice of the particular phenolic polymer, novolak and the photosensitive component.

Other additives, such as adhesion promoters, wetting agents, dyes and plasticizers, may also be added.

If necessary, sensitizers in small amounts may also be added in order to sensitize the compounds in the relatively long-wavelength UV range to the visible range. Polycyclic aromatics, such as pyrene and perylene, are preferred for this purpose, but other dyes which act as sensitizers may also be used.

For example, the polymeric binder (a), which contains from 10 to 40 mol % of a monomer component having acid-labile groups, and from 2 to 30, particularly preferably from 5 to 15, % by weight, based on the total weight of the compounds (a) and (b), of a compound of type (b) are preferably dissolved in a solvent, eg. methylglycol acetate or methylpropylene glycol acetate, the solids content being from 10 to 30% by weight.

The solution of the novel radiation-sensitive mixture can be filtered through a filter having a pore diameter of 0.2 μm.

By applying the resist solution by spin coating at speeds of from 1,000 to 10,000 rpm, a resist film having a layer thickness of from 0.1 to 5 μm is produced on a wafer (for example a silicon wafer oxidized at the surface). The wafer is then heated for from 1 to 5 minutes at 90° C. or 80° C.

In the novel process for the production of relief images, a radiation-sensitive recording layer which essentially consists of the novel radiation-sensitive mixture is exposed imagewise to a dose such that the solubility of the exposed parts in aqueous alkaline solvents increases after heating at from 60° to 120° C. and these parts can be selectively removed using the alkaline developer.

The resist films are exposed, for example through a chromium-plated structured quartz mask, to UV light from a mercury lamp, to excimer laser light, to electron beams or to X-rays. The imagewise exposed films can then be heated, for example for from 5 seconds to 2 minutes at from 60° to 110° C., and then developed with aqueous alkaline developers, the exposed parts being removed selectively while only a little material is removed in the unexposed parts.

In the Examples which follow, parts and percentages are by weight, unless stated otherwise.

EXAMPLE 1

Synthesis of poly-(p-hydroxystyrene-co-haloethoxycarbonyloxystyrene)

Poly-(p-hydroxystyrene-co-20 mol % chloroethoxycarbonyloxystyrene) is prepared as follows: 5 g of poly-(p-hydroxystyrene) (commercial product from Polysciences Inc., $\overline{M}_w = 1500-7000$ g/mol) are dissolved in sodium hydroxide solution (4 g of NaOH and 20 g of $H_2O$). Thereafter, 1 g of 2-chloroethyl chloroformate is added dropwise at room temperature. The temperature is increased by about 5° C. The reaction time is 30 minutes. The mixture is then diluted with 20 ml of $H_2O$ and 10 ml of acetone and neutralized with dilute HCl (pH 5). The product thus obtained is extracted with 100 ml of tetrahydrofuran and the extract is separated off and evaporated virtually to dryness. The residue is dissolved in about 30 ml of ethyl acetate and the solution is dried over $Na_2SO_4$. The binder is then precipitated in 800 ml of naphtha and is filtered off under suction. The crude product is finally purified by extraction with methylene chloride.

A photoresist solution is prepared from 95 parts of poly-(p-hydroxystyrene-co-20 mol % chloroethoxycarbonyloxystyrene), 5 parts of triphenylsulfonium hexafluoroarsenate (commercial product from Alfa) and 300 parts of ethylglycol acetate. The solution is then filtered through a filter having a pore diameter of 0.2 μm.

The resist solution is applied to an oxidized silicon wafer in a layer thickness of 1 μm by spin coating. The wafer coated in this manner is dried for 4 minutes at 80° C. and then exposed imagewise for 5 seconds to excimer laser light of wavelength λ=248 nm using an imagewise structured test mask by the contact process. Thereafter, heating is carried out for 60 seconds at 80° C. and development is effected with a developer having a pH of from 12.1 to 13.4 for about 60 seconds.

EXAMPLE 2

A photoresist solution is prepared from 90 parts of poly-(p-hydroxystyrene-co-20 mol % chloroethoxycarbonyloxystyrene), 10 parts of triphenylsulfonium hexafluorophosphate and 300 parts of ethylglycol acetate. The procedure described in Example 1 is followed. The sensitivity for a layer thickness of 1 μm is 280 mJ/cm².

EXAMPLE 3

A photoresist solution is prepared from 95 parts of poly-(p-hydroxystyrene-co-30 mol % trichloroethoxycarbonyloxystyrene), 5 parts of triphenylsulfonium hexafluoroarsenate and 300 parts of ethylglycol acetate. The procedure described in Example 1 is followed. The sensitivity for a layer thickness of 1 μm is 150 mJ/cm².

EXAMPLE 4

A photoresist solution is prepared from 95 parts of poly-(p-hydroxystyrene-co-20 mol % trichloroethoxycarbonyloxystyrene), 5 parts of dimethyl-4-hydroxyphenylsulfonium trillate and 300 parts of ethylglycol acetate. The procedure described in Example 1 is followed. The sensitivity for a layer thickness of 1 μm is 400 mJ/cm².

What is claimed is:

1. A positive-working radiation-sensitive mixture wherein radiated parts become soluble in alkaline developers, consisting essentially of
   (a) a binder or binder mixture which is insoluble in water but soluble in aqueous alkaline solutions and
   (b) a compound which forms a strong acid on exposure to radiation,
wherein the binder (a) is phenolic resin in which from 5 to 50% of the phenolic hydroxy groups have been replaced by β-halogenated alkyl carbonate groups, and wherein compound (b) is a sulfonium salt of the formula (II)

where R', R" and R''' are identical or different and are each alkyl of 1 to 3 carbon atoms, phenyl, phenyl substituted by OH or alkyl of 1–3 carbons, or benzyl and $X^{\ominus}$ is $AsF_6^{\ominus}$, $SbF_6^{\ominus}$, $PF_6^{\ominus}$, $ClO_4^{\theta}$, $BF_4^{\ominus}$ and/or $CF_3SO_3^{\ominus}$.

2. A radiation-sensitive mixture as defined in claim 1, wherein the phenolic resin is a novolak which has a mean molecular weight $\overline{M}_w$ of from 300 to 20,000 and in which from 5 to 50% of the phenolic hydroxyl groups have been replaced by β-halogenated alkyl carbonate groups.

3. A radiation-sensitive mixture as defined in claim 1, wherein the phenolic resin is a poly-(p-hydroxystyrene) or poly-(p-hydroxy-α-methylstyrene) which has a mean molecular weight $\overline{M}_w$ of from 200 to 100,000 and in which from 5 to 50% of the phenolic hydroxyl groups have been replaced by β-halogenated alkyl carbonate groups.

4. A radiation-sensitive mixture as defined in claim 1, wherein the β-halogenated alkyl carbonate group is of the formula (I)

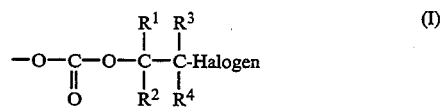

where halogen is chlorine or bromine, $R^1$ and $R^2$ are identical or different and are-each hydrogen or methyl and $R^3$ and $R^4$ are identical or different and are each hydrogen or chlorine.

5. A radiation-sensitive mixture as defined in claim 1, wherein, in the sulfonium salt of the formula (II), at least one of the radicals R', R" and R''' is a radical

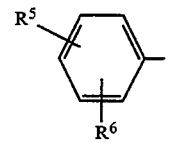

where $R^5$ and $R^6$ are identical or different and are each H, OH, alkyl of 1 to 3 carbon atoms.

6. A radiation-sensitive mixture as defined in claim 1, which contains from 70 to 98% by weight of component (a) and from 2 to 30% by weight of component (b).

7. A radiation-sensitive mixture as defined in claim 1, wherein the mixture additionally contains, as a sensitizer, a polycyclic aromatic compound which absorbs radiation and transfers it to the acid-forming compound (b).

8. A process for the production of relief structures or relief images by application of a photoresist solution in a layer thickness of from 0.1 to 5 μm to a substrate pretreated in a conventional manner, drying, imagewise exposure, heating to 50°–150° C. and development with an aqueous alkaline solution, wherein the photoresist solution used contains a radiation-sensitive mixture as defined in claim 1.

* * * * *